United States Patent
Chi et al.

(10) Patent No.: US 9,484,199 B2
(45) Date of Patent: Nov. 1, 2016

(54) PECVD MICROCRYSTALLINE SILICON GERMANIUM (SIGE)

(71) Applicant: Applied Materials, Inc., Santa Clara, CA (US)

(72) Inventors: Hyo-In Chi, Dublin, CA (US); Farzad Dean Tajik, Los Gatos, CA (US); Michel Anthony Rosa, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 107 days.

(21) Appl. No.: 14/459,357

(22) Filed: Aug. 14, 2014

(65) Prior Publication Data

US 2015/0072509 A1    Mar. 12, 2015

Related U.S. Application Data

(60) Provisional application No. 61/874,831, filed on Sep. 6, 2013.

(51) Int. Cl.
| | |
|---|---|
| *H05H 1/24* | (2006.01) |
| *H01L 21/02* | (2006.01) |
| *C23C 16/02* | (2006.01) |
| *C23C 16/42* | (2006.01) |

(52) U.S. Cl.
CPC ....... *H01L 21/0262* (2013.01); *C23C 16/0272* (2013.01); *C23C 16/42* (2013.01); *H01L 21/0245* (2013.01); *H01L 21/02532* (2013.01); *H01L 21/02579* (2013.01)

(58) Field of Classification Search
CPC .............. C23C 16/0272; C23C 16/42; H01L 21/02532; H01L 21/0262; H01L 21/02579

USPC .......................................................... 427/569
See application file for complete search history.

(56) References Cited

U.S. PATENT DOCUMENTS

| | | | |
|---|---|---|---|
| 8,383,441 B2 | 2/2013 | El Rifai et al. | |
| 2005/0037598 A1* | 2/2005 | Witvrouw ........... C23C 16/0272 | 438/488 |
| 2010/0255662 A1 | 10/2010 | Witvrouw | |
| 2013/0020548 A1* | 1/2013 | Clark .................. H01L 45/1233 | 257/3 |

FOREIGN PATENT DOCUMENTS

GB        2 312 439 A      10/1997

OTHER PUBLICATIONS

Lee, et al.; A Low Temperature, Low Stress SiGe Process; 5 total pages; date unknown.

Yu, et al.; Journal of Semiconductors; Effects of Seed Layer on the Performance of Microcrystalline Silicon Germanium Solar Cells; vol. 34, No. 3; Mar. 2013; 5 total pages.

(Continued)

*Primary Examiner* — Kelly M Gambetta
(74) *Attorney, Agent, or Firm* — Patterson & Sheridan, LLP

(57) ABSTRACT

Embodiments of the present invention generally relate to methods for forming a SiGe layer. In one embodiment, a seed SiGe layer is first formed using plasma enhanced chemical vapor deposition (PECVD), and a bulk SiGe layer is formed directly on the PECVD seed layer also using PECVD. The processing temperature for both seed and bulk SiGe layers is less than 450 degrees Celsius.

18 Claims, 2 Drawing Sheets

(56) References Cited

OTHER PUBLICATIONS

Perez, et al.; Effects of Boron Addition on a-Si90Ge10:H Films Obtained by Low Frequency Plasma Enhanced Chemical Vapour Deposition; Institute of Physics Publishing; J. Phys.: Condens. Matter 17; pp. 3975-3983; 2005.
Moreno, et al.; ScienceDirect; Arrays of Un-Cooled Micro-Bolometers Based on Amorphous Silicon—Germanium Thin Films Deposited by Plasma; Journal of Non-Crystalline Solids 354; pp. 2552-2555; 2008.
PCT Notification of Transmittal of the International Search Report and the Written Opinion of the International Searching Authority for International Application No. PCT/US2014/051301 dated Nov. 27, 2014; 10 total pages.

* cited by examiner

PECVD MICROCRYSTALLINE SILICON GERMANIUM (SIGE)

CROSS-REFERENCE TO RELATED APPLICATIONS

This application claims priority to U.S. Provisional Patent Application Ser. No. 61/874,831, filed on Sep. 6, 2013, which herein is incorporated by reference.

BACKGROUND

1. Field of the Invention

Embodiments of the present invention generally relate to a method for forming a silicon germanium (SiGe) layer.

2. Description of the Related Art

Micro-electromechanical systems (MEMS) are used in a wide variety of systems such as accelerometers, gyroscopes, infrared detectors, micro turbines, silicon clocks, and the like. Monolithic integration of MEMS and complementary metal-oxide semiconductor (CMOS) processing is a desirable solution in certain applications, such as detectors and displays, as the integration simplifies the interconnection issues. One easy approach for monolithic integration is post-processing MEMS on top of the driving electronics, since the standard fabrication processes used for preparing the driving electronics are not changed. However, post processing imposes an upper limit on the fabrication temperature of MEMS to avoid any damage or degradation in the performance of the driving electronics.

SiGe has been proposed as a structural material for MEMS that can be post-processed on top of standard CMOS driving and controlling electronics. A functional SiGe layer for use in microstructure devices may be over 2 micrometers thick and may be formed by depositing multiple layers of SiGe at 450 degrees Celsius. Therefore, an improved method for forming the SiGe layer is needed.

SUMMARY OF THE INVENTION

Embodiments of the present invention generally relate to methods for forming a SiGe layer. In one embodiment, a seed SiGe layer is first formed using plasma enhanced chemical vapor deposition (PECVD), and a bulk SiGe layer is formed directly on the PECVD seed layer also using PECVD. The processing temperature for both seed and bulk SiGe layers is less than 450 degrees Celsius.

In one embodiment, a method for forming a silicon germanium layer is disclosed. The method includes depositing a seed silicon germanium layer over a substrate using plasma enhanced chemical vapor deposition (PECVD), wherein the substrate has a first temperature that is less than 450 degrees Celsius during processing. The method further includes depositing a bulk silicon germanium layer directly on the seed silicon germanium layer using PECVD, wherein the substrate has a second temperature that is less than 450 degrees Celsius during processing.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods for forming a SiGe layer. In one embodiment, a seed SiGe layer is first formed on a substrate surface using plasma enhanced chemical vapor deposition (PECVD), and a bulk SiGe layer is formed directly on the PECVD seed layer also using PECVD. The processing temperature for both seed and bulk SiGe layers is less than 450 degrees Celsius.

Figure 1:
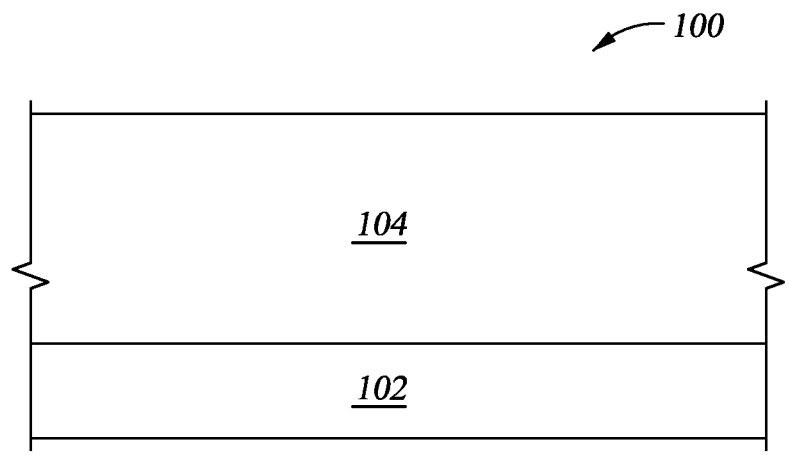
FIG. 1 shows a SiGe layer having a seed SiGe layer and a bulk SiGe layer according to one embodiment of the invention.

FIG. 1 shows a SiGe layer 100 having a seed SiGe layer 102 and a bulk SiGe layer 104 according to one embodiment of the invention. The SiGe layer 100 may be formed on a CMOS structure. The process steps of forming the seed SiGe layer 102 and the bulk SiGe layer 104 are described in FIG. 2.

Figure 2:
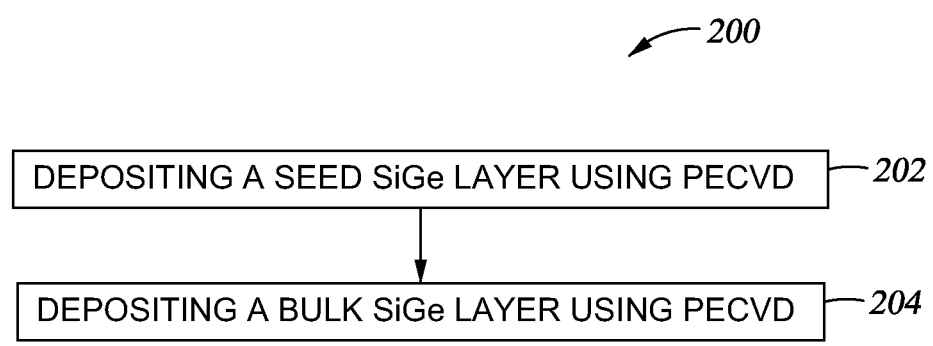
FIG. 2 shows process steps of forming the seed and bulk SiGe layers according to one embodiment of the invention.

FIG. 2 shows process steps 200 for forming the SiGe layer 100. At block 202, the seed SiGe layer 102 is deposited using PECVD. The seed SiGe layer 102 may be deposited on a CMOS structure. Since the CMOS structure may not withstand elevated temperature, the depositions of both the seed SiGe layer 102 and the bulk SiGe layer 104 are both performed at a temperature below 450 degrees Celsius, such as at 420 degrees Celsius.

Figure 3:
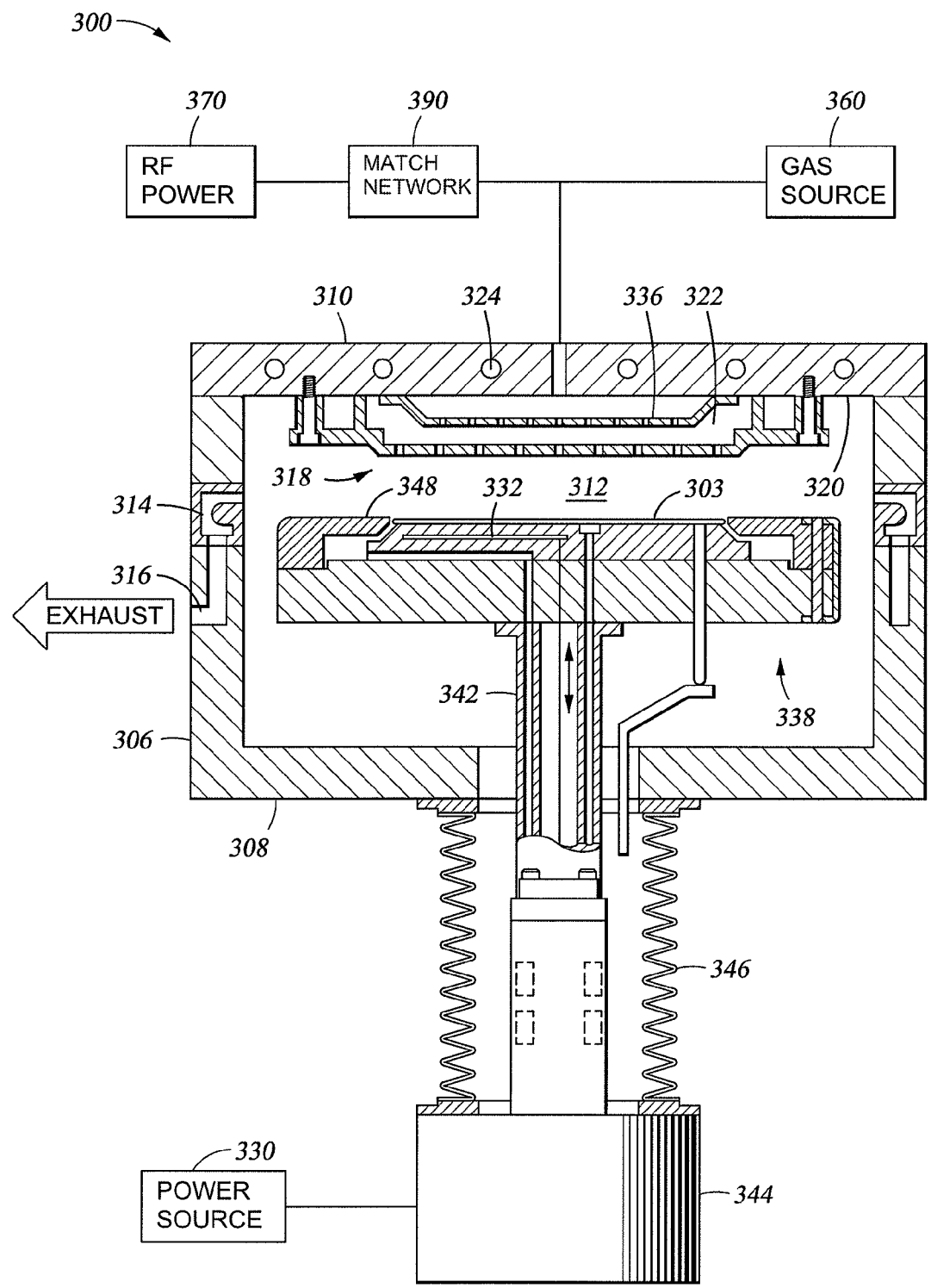
FIG. 3 shows a PECVD chamber that may be used to perform the process steps of FIG. 2 according to one embodiment of the invention.

In one embodiment, seed SiGe layer 102 is deposited in a PECVD chamber, such as the PECVD chamber 300 shown in FIG. 3. In one example of a process performed in block 202, a plasma is formed using an RF power ranging from about 300 W to about 600 W at an RF frequency of 13.56 MHz, while the substrate having the CMOS structure is maintained at a temperature below 450 degrees Celsius, such as at 420 degrees Celsius. The RF power may be adjusted to fine tune the film stress. The processing pressure in the processing region is maintained at between about 3 Torr and about 4.2 Torr. The plasma contains a processing gas mixture including a silicon containing gas, a germanium containing gas, a boron containing gas and hydrogen gas. In one embodiment, the germanium containing gas and the boron containing gas are pre-mixed with the hydrogen gas in the gas cylinder. In one embodiment, the silicon containing gas is silane ($SiH_4$), the germanium containing gas is germane ($GeH_4$), and the boron containing gas is diborane ($B_2H_6$). In one embodiment, the $SiH_4$ gas has a flow rate between about 0.064 sccm/cm$^2$ and about 0.085 sccm/cm$^2$, the $GeH_4$ gas has a flow rate between about 0.354 sccm/cm$^2$ and about 0.476 sccm/cm$^2$, the hydrogen gas has a flow rate between about 5.941 sccm/cm$^2$ and about 7.779 sccm/cm$^2$ and $B_2H_6$ gas has a flow rate between about 0.064 sccm/cm$^2$ and about 0.085 sccm/cm$^2$. The flow rates are per each square centimeter of the surface area of the substrate or substrates so the total flow for any size substrate is readily determined. The deposition process may last between about 50 seconds and about 140 seconds, forming the seed SiGe layer 102 having a thickness between about 0.1 micrometers and about 0.25 micrometers.

Next, at block 204, the bulk SiGe layer 104 is deposited directly on the seed SiGe layer 102 using PECVD. The bulk SiGe layer 104 may be deposited in the same PECVD chamber that deposits the seed SiGe layer 102 when cleaning or etching of the seed SiGe layer 102 is not required or can be performed in the same PECVD chamber. In one example of a process performed in block 204, a plasma is formed using an RF power between about 600 W and about 800 W at an RF frequency of 13.56 MHz, while the substrate having the CMOS structure and the seed SiGe layer is maintained at a temperature below 450 degrees Celsius, such as at 420 degrees Celsius. The processing pressure in the processing region is maintained at between about 3 Torr and about 4.2 Torr. The plasma contains a processing gas mixture including a silicon containing gas, a germanium containing gas, a boron containing gas and hydrogen gas. In one embodiment, the germanium containing gas and the boron containing gas are pre-mixed with the hydrogen gas in the gas cylinder. In one embodiment, the silicon containing gas is silane ($SiH_4$), the germanium containing gas is germane ($GeH_4$), and the boron containing gas is diborane ($B_2H_6$). In one embodiment, the $SiH_4$ gas has a flow rate between about 0.141 sccm/cm$^2$ and about 0.282 sccm/cm$^2$, the $GeH_4$ gas has a flow rate between about 1.160 sccm/cm$^2$ and 1.414 sccm/cm$^2$, the hydrogen gas has a flow rate between about 6.365 sccm/cm$^2$ and about 7.779 sccm/cm$^2$ and $B_2H_6$ gas has a flow rate between about 0.113 sccm/cm$^2$ and about 0.212 sccm/cm$^2$. The deposition process may last between about 400 seconds and about 1000 seconds, forming the bulk SiGe layer 104 having a thickness ranging from about 2.5 micrometers to over 10 micrometers. In one embodiment, the bulk SiGe layer 104 has a thickness of greater than or equal to about 10 micrometers. Such thick bulk SiGe layer 104 is deposited in a single deposition process using PECVD.

FIG. 3 is a PECVD process chamber 300 that may be used to perform the process steps of FIG. 2 according to one embodiment of the invention. The process chamber 300 includes walls 306, a bottom 308, and a lid 310 that define a process volume 312. The walls 306 and bottom 308 are typically fabricated from a unitary block of aluminum. The walls 306 may have conduits (not shown) therein through which a fluid may be passed to control the temperature of the walls 306. The process chamber 300 may also include a pumping ring 314 that couples the process volume 312 to an exhaust port 316 as well as other pumping components (not shown).

A substrate support assembly 338, which may be heated, may be centrally disposed within the process chamber 300. The substrate support assembly 338 supports a substrate 303 during a deposition process. The substrate support assembly 338 generally is fabricated from aluminum, ceramic or a combination of aluminum and ceramic and typically includes a vacuum port (not shown) and at least one or more heating elements 332.

The vacuum port may be used to apply a vacuum between the substrate 303 and the substrate support assembly 338 to secure the substrate 303 to the substrate support assembly 338 during the deposition process. The one or more heating elements 332 may be, for example, electrodes disposed in the substrate support assembly 338, and coupled to a power source 330, to heat the substrate support assembly 338 and substrate 303 positioned thereon to a predetermined temperature.

Generally, the substrate support assembly 338 is coupled to a stem 342. The stem 342 provides a conduit for electrical leads, vacuum and gas supply lines between the substrate support assembly 338 and other components of the process chamber 300. Additionally, the stem 342 couples the substrate support assembly 338 to a lift system 344 that moves the substrate support assembly 338 between an elevated position (as shown in FIG. 2) and a lowered position (not shown). Bellows 346 provides a vacuum seal between the process volume 312 and the atmosphere outside the chamber 300 while facilitating the movement of the substrate support assembly 338.

The substrate support assembly 338 additionally supports a circumscribing shadow ring 348. The shadow ring 348 is annular in form and typically comprises a ceramic material such as, for example, aluminum nitride. Generally, the shadow ring 348 prevents deposition at the edge of the substrate 303 and substrate support assembly 338.

The lid 310 is supported by the walls 306 and may be removable to allow for servicing of the process chamber 300. The lid 310 may generally be comprised of aluminum and may additionally have heat transfer fluid channels 324 formed therein. The heat transfer fluid channels 324 are coupled to a fluid source (not shown) that flows a heat transfer fluid through the lid 310. Fluid flowing through the heat transfer fluid channels 324 regulates the temperature of the lid 310.

A showerhead 318 may generally be coupled to an interior side 320 of the lid 310. A perforated blocker plate 336 may optionally be disposed in the space 322 between the showerhead 318 and lid 310. Gases (i.e., process and other gases) that enter the process chamber 300 through the mixing block are first diffused by the blocker plate 336 as the gases fill the space 322 behind the showerhead 318. The gases then pass through the showerhead 318 and into the process chamber 300. The blocker plate 336 and the showerhead 318 are configured to provide a uniform flow of gases to the process chamber 300. Uniform gas flow is desirable to promote uniform layer formation on the substrate 303. During the deposition process of the seed SiGe layer 102, the distance between the substrate 303 and the showerhead 318 is between about 320 mm and about 370 mm. During the deposition process of the bulk SiGe layer 104, the distance between the substrate 303 and the showerhead 318 is between about 530 mm and about 580 mm.

A gas source 360 is coupled to the lid 310 to provide gas through gas passages in the showerhead 318 to a processing area between the showerhead 318 and the substrate 303. A vacuum pump (not shown) may be coupled to the process chamber 300 to control the process volume at a desired pressure. An RF source 370 is coupled through a match network 390 to the lid 310 and/or to the showerhead 318 to provide an RF current to the showerhead 318. The RF current creates an electric field between the showerhead 318 and the substrate support assembly 338 so that plasma may be generated from the gases between the showerhead 318 and the substrate support assembly 338. The RF power may be adjusted to fine tune the stress of the SiGe layer 100.

In summary, a method for forming a SiGe layer is disclosed. The method includes forming a seed SiGe layer and a bulk SiGe layer directly on the seed SiGe layer, and both layers are formed using PECVD. The seed SiGe layer may be formed on top of a CMOS structure, and to prevent damaging the CMOS structure, the substrate on which the seed and bulk layers are deposited has a temperature that is below 450 degrees Celsius, such as 420 degrees Celsius, during the deposition of both the seed and bulk layers. The bulk SiGe layer may be over 10 micrometers and may be formed in a single deposition using PECVD.

While the foregoing is directed to embodiments of the present invention, other and further embodiments of the invention may be devised without departing from the basic scope thereof, and the scope thereof is determined by the claims that follow.

The invention claimed is:

1. A method for forming a silicon germanium layer, comprising:
   depositing a seed silicon germanium layer over a substrate using plasma enhanced chemical vapor deposition (PECVD), wherein the substrate has a first temperature that is less than 450 degrees Celsius during processing, wherein the PECVD for depositing the seed silicon germanium layer has an RF power between about 300 W and about 600 W; and
   depositing a bulk silicon germanium layer directly on the seed silicon germanium layer using PECVD, wherein the substrate has a second temperature that is less than 450 degrees Celsius during processing, wherein the PECVD for depositing the bulk silicon germanium layer has an RF power between about 600 W and about 800 W.

2. The method of claim 1, wherein the substrate includes a complementary metal-oxide semiconductor (CMOS) structure and the seed silicon germanium layer is deposited over the CMOS structure.

3. The method of claim 1, wherein the PECVD for depositing the seed silicon germanium layer has a process pressure between about 3 Torr and about 4.2 Torr.

4. The method of claim 1, wherein the PECVD for depositing the bulk silicon germanium layer has a process pressure between about 3 Torr and about 4.2 Torr.

5. The method of claim 1, further comprising flowing a gas mixture during the depositing of the seed silicon germanium layer, wherein the gas mixture comprises a silicon containing gas, a germanium containing gas, a boron containing gas and a hydrogen gas.

6. The method of claim 5, wherein the silicon containing gas is silane.

7. The method of claim 5, wherein the germanium containing gas is germane.

8. The method of claim 5, wherein the boron containing gas is diborane.

9. The method of claim 5, wherein the silicon containing gas has a flow rate between about 0.064 sccm/cm$^2$ and 0.085 sccm/cm$^2$.

10. The method of claim 5, wherein the germanium containing gas has a flow rate between about 0.354 sccm/cm$^2$ and about 0.476 sccm/cm$^2$.

11. The method of claim 5, wherein the boron containing gas has a flow rate between about 0.064 sccm/cm$^2$ and about 0.085 sccm/cm$^2$.

12. The method of claim 5, wherein the hydrogen gas has a flow rate between about 5.941 sccm/cm$^2$ and about 7.779 sccm/cm$^2$.

13. A method for forming a silicon germanium layer, comprising:
   depositing a seed silicon germanium layer over a substrate using plasma enhanced chemical vapor deposition (PECVD), wherein the substrate has a first temperature that is less than 450 degrees Celsius during processing, wherein the PECVD for depositing the seed silicon germanium layer has an RF power between about 300 W and about 600 W; and
   depositing a bulk silicon germanium layer directly on the seed silicon germanium layer using PECVD, wherein the substrate has a second temperature that is less than 450 degrees Celsius and a gas mixture is introduced during the depositing of the bulk silicon germanium layer, and wherein the gas mixture comprises a silicon containing gas, a germanium containing gas, a boron containing gas and a hydrogen gas, and wherein the PECVD for depositing the bulk silicon germanium layer has an RF power between about 600 W and about 800 W.

14. The method of claim 13, wherein the silicon containing gas has a flow rate between about 0.141 sccm and about 0.282 sccm/cm$^2$.

15. The method of claim 13, wherein the germanium containing gas has a flow rate between about 1.160 sccm/cm$^2$ to about 1.414 sccm/cm$^2$.

16. The method of claim 13, wherein the boron containing gas has a flow rate between about 0.113 sccm/cm$^2$ and about 0.212 sccm/cm$^2$.

17. The method of claim 13, wherein the hydrogen gas has a flow rate between about 6.365 sccm/cm$^2$ and about 7.779 sccm/cm$^2$.

18. The method of claim 13, wherein the silicon containing gas is silane.

* * * * *